(12) United States Patent
Oliver et al.

(10) Patent No.: US 12,172,257 B2
(45) Date of Patent: Dec. 24, 2024

(54) FOUR-POINT TILT ALIGNMENT WAFER CHUCK

(71) Applicant: KLA Corporation, Milpitas, CA (US)

(72) Inventors: Warren C. Oliver, Milpitas, CA (US);
Michael Drake, Milpitas, CA (US);
Richard Anthony, Milpitas, CA (US);
Kurt Johanns, Milpitas, CA (US);
Jennifer Hay, Milpitas, CA (US)

( * ) Notice: Subject to any disclaimer, the term of this patent is extended or adjusted under 35 U.S.C. 154(b) by 349 days.

(21) Appl. No.: 17/687,044

(22) Filed: Mar. 4, 2022

(65) Prior Publication Data

US 2023/0182248 A1 Jun. 15, 2023

Related U.S. Application Data

(60) Provisional application No. 63/287,974, filed on Dec. 10, 2021.

(51) Int. Cl.
*B23Q 3/04* (2006.01)
*H01L 21/687* (2006.01)

(52) U.S. Cl.
CPC ............. *B23Q 3/04* (2013.01); *H01L 21/6875* (2013.01)

(58) Field of Classification Search
CPC ......... B23Q 3/04; B23Q 1/25; H01L 21/6875; H01L 21/68764; H01L 21/68785; H01L 21/68792; B25H 1/14; B25H 1/16; B25H 1/18; B25J 17/0266; G05B 19/4097; B24B 7/228; B24B 13/005; B24B 37/005; B24B 37/042; B24B 37/30; B25B 11/005

(Continued)

(56) References Cited

U.S. PATENT DOCUMENTS 5,025,568 A * 6/1991 Grimes .................... G01C 9/36
33/384
7,182,672 B2 * 2/2007 Tunaboylu .............. B24B 19/16
451/36

(Continued)

FOREIGN PATENT DOCUMENTS

JP H05333100 A * 12/1993 ............. H01L 21/66
JP 2019053924 A 4/2019

(Continued)

OTHER PUBLICATIONS

WIPO, International Search Report for International Application No. PCT/US2022/049177, Mar. 28, 2023.

(Continued)

*Primary Examiner* — Laura C Guidotti
*Assistant Examiner* — Caleb Andrew Holizna
(74) *Attorney, Agent, or Firm* — Hodgson Russ LLP

(57) ABSTRACT

An apparatus includes a chuck configured to hold a wafer and a tilt plate disposed beneath the chuck and adjustably connected to the chuck by a pair of upper screws and a pair of lower screws separately arranged in opposite corners of the chuck. Screw heads of the pair of upper screws rest against a top surface of the chuck, such that clockwise rotation of one of the upper screws pushes a corresponding corner of the chuck toward the tilt plate. Screw heads of the pair of lower screws rest against a bottom surface of the chuck, such that counter-clockwise rotation of one of the lower screws pushes a corresponding corner of the chuck away from the tilt plate.

20 Claims, 7 Drawing Sheets

(58) Field of Classification Search
USPC ...... 269/58, 60, 71, 73, 289 R, 903; 451/41,
451/42, 43, 44, 289, 365, 380, 384, 387,
451/388, 405, 412, 414, 494
See application file for complete search history.

(56) References Cited

U.S. PATENT DOCUMENTS

| | | |
|---|---|---|
| 10,288,540 B1 | 5/2019 | Hay |
| 2011/0042006 A1* | 2/2011 | Wang ..................... H01L 22/20 |
| | | 702/81 |
| 2018/0023191 A1* | 1/2018 | Gangakhedkar ...... C23C 14/505 |
| | | 269/40 |

FOREIGN PATENT DOCUMENTS

| | | | |
|---|---|---|---|
| KR | 19980018590 A | 6/1998 | |
| KR | 19980074911 A | 11/1998 | |
| WO | WO-2010008747 A2 * | 1/2010 | ....... H01L 21/68742 |

OTHER PUBLICATIONS

WIPO, Written Opinion of the International Searching Authority for International Application No. PCT/US2022/049177, Mar. 28, 2023.
Yu et al., "Performance and modeling of paired polishing process," International Journal of Machine Tools and Manufacture, vol. 109, pp. 49-57, Jul. 7, 2016.

\* cited by examiner

FOUR-POINT TILT ALIGNMENT WAFER CHUCK

CROSS-REFERENCE TO RELATED APPLICATIONS

This application claims priority to the provisional patent application filed Dec. 10, 2021 and assigned U.S. App. No. 63/287,974, the disclosure of which is hereby incorporated by reference.

FIELD OF THE DISCLOSURE

This disclosure relates to a chuck for holding a semiconductor wafer and, more particularly, to a tiltable chuck for mechanical probe testing of a semiconductor wafer.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer or EUV mask using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

After certain steps of semiconductor fabrication processes, adhesion tests may be performed to test the adhesion of a deposited film layer on a wafer substrate held by a chuck. Such tests use a wedge-shaped probe which is brought into contact with the deposited film, leaving spall marks/fractures. The accuracy of the adhesion may be improved when the wafer substrate is orthogonal to the wedge-shaped probe. However, probe tips cannot be manufactured and mounted to inspection equipment with sufficient alignment tolerances to be orthogonal to the wafer upon install. Thus, the angle of the wafer may be calibrated by inspecting the spall fractures left in the wafer. When the spall fractures are nearly symmetrical about the impression left by the probe, this may indicate the wafer substrate and the wedge-shaped probe are orthogonal. When the spall fractures are more on one side of the impression left by the probe, may indicate that that the wafer is not orthogonal to the wedge-shaped probe. In these cases, it may be desirable to tilt the chuck to be orthogonal to the wedge-shaped probe. In some instances, the wafer may be replaced with a reference sample to perform angle calibration.

Two primary mechanisms have been used for chuck tilt alignments: (1) 3-point adjustments and (2) gimbal devices:

3-point tilt adjustment is based on the incidence of three non-collinear points in a single plane. When one or two of the points are adjusted, the plane angle can be changed. However, a chuck with 3-point adjustment has low stiffness and positional variation of stiffness. This can compromise the accuracy of adhesion tests due to varying penetration depth and force measurements depending on the probe position on the wafer. Alignments using this technique are also complex because adjustment of one point causes the chuck to tilt in multiple axes. In other words, a single tilt axis can only be adjusted accurately by adjusting two of the points.

Gimbal devices typically have a single support axis and at least one additional off-axis tilt adjustment. Each axis can be adjusted for tilt alignment. However, the single support axis of gimbal devices also has lower stiffness and positional variation of stiffness, which can compromise the accuracy of adhesion tests due to varying penetration depth and force measurements depending on the probe position on the wafer.

Therefore, what is needed is a chuck having high stiffness and low positional variation of stiffness for improved accuracy during mechanical probe testing.

BRIEF SUMMARY OF THE DISCLOSURE

An embodiment of the present disclosure provides an apparatus. The apparatus may include a chuck configured to hold a wafer. The apparatus may further include a tilt plate disposed beneath the chuck. The tilt plate may be adjustably connected to the chuck by a pair of upper screws and a pair of lower screws separately arranged in opposite corners of the chuck. Screw heads of the pair of upper screws rest against a top surface of the chuck, such that clockwise rotation of one of the upper screws may push a corresponding corner of the chuck toward the tilt plate. Screw heads of the pair of lower screws rest against a bottom surface of the chuck, such that counter-clockwise rotation of one of the lower screws may push a corresponding corner of the chuck away from the tilt plate.

According to an embodiment of the present disclosure, the apparatus may further include a pair of upper springs surrounding the pair of upper of screws and a pair of lower springs surrounding the pair of lower screws. The pair of lower springs and the pair of upper springs may have a pre-load between the bottom surface of the chuck and a top surface of the tilt plate.

According to an embodiment of the present disclosure, counter-clockwise rotation of one of the upper screws may cause the corresponding one of the upper springs to push the corresponding corner of the chuck away from the tilt plate. Clockwise rotation of one of the lower screws may separate the screw head of the lower screw from the bottom surface of the chuck.

According to an embodiment of the present disclosure, the chuck may include includes four throughbores extending from the top surface of the chuck to the bottom surface of the chuck, and at least part of the pair of upper screws and at least part of the pair of lower screws may be disposed within the throughbores. Each of the throughbores may include an upper section opening to the top surface of the chuck, and a lower section opening to the bottom surface of the chuck. A diameter of the upper section may be less than a diameter of the lower section, which defines an annular surface therebetween. Screw shafts of the pair of upper screws may extend through the upper section and the lower section. The screw heads of the pair of lower screws may be disposed in the lower section, may rest against the annular surface, and may be accessible via the upper section. The pair of upper springs and the pair of lower springs may be disposed in the lower section of each of the throughbores and may rest against the annular surface. The tilt plate may include four threaded holes aligned with the four throughbores, and the pair of upper screws and the pair of lower screws may be threadably received by the threaded holes.

According to an embodiment of the present disclosure, the top surface of the chuck plate may include a recessed sample area configured to receive the wafer. The top surface of the chuck plate may further include a reference area configured to receive a reference material. The reference area may be separate from the sample area.

According to an embodiment of the present disclosure, the apparatus may further include a wedge-shaped indenter. The wedge-shaped indenter may be configured to probe the wafer disposed in the sample area and/or the reference material disposed in the reference area. The chuck may lie in a plane orthogonal to the wedge-shaped indenter.

According to an embodiment of the present disclosure, the apparatus may further include a base plate disposed beneath the tilt plate and removably secured to the tilt plate.

An embodiment of the present disclosure provides a method. The method may include securing a chuck on top of a tilt plate using a pair of upper screws and a pair of lower screws separately arranged in opposite corners of the chuck, and disposing a wafer on the chuck. Screw heads of the pair of upper screws may rest against a top surface of the chuck, such that clockwise rotation of one of the upper screws may push a corresponding corner of the chuck toward the tilt plate. Screw heads of the pair of lower screws may rest against a bottom surface of the chuck, such that counter-clockwise rotation of one of the lower screws may push a corresponding corner of the chuck away from the tilt plate. A pair of upper springs may surround the pair of upper of screws, a pair of lower springs may surround the pair of lower screws, and the pair of lower springs and the pair of upper springs may have a pre-load between the bottom surface of the chuck and a top surface of the tilt plate.

According to an embodiment of the present disclosure, the method may further include adjusting a plane of the chuck relative to the tilt plate by counter-clockwise rotation of one of the upper screws, which may cause the corresponding one of the upper springs to push the corresponding corner of the chuck away from the tilt plate.

According to an embodiment of the present disclosure, the method may further include adjusting a plane of the chuck relative to the tilt plate by clockwise rotation of one of the lower screws, which may separate the screw head of the lower screw from the bottom surface of the chuck.

According to an embodiment of the present disclosure, the method may further include probing the wafer disposed in a sample area on the top surface of the chuck using a wedge-shaped indenter. The chuck may lie in a plane orthogonal to the wedge-shaped indenter.

According to an embodiment of the present disclosure, the method may further include disposing a reference material in a reference area on the top surface of the chuck, and probing the reference material using the wedge-shaped indenter. The reference area may be separate from the sample area.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
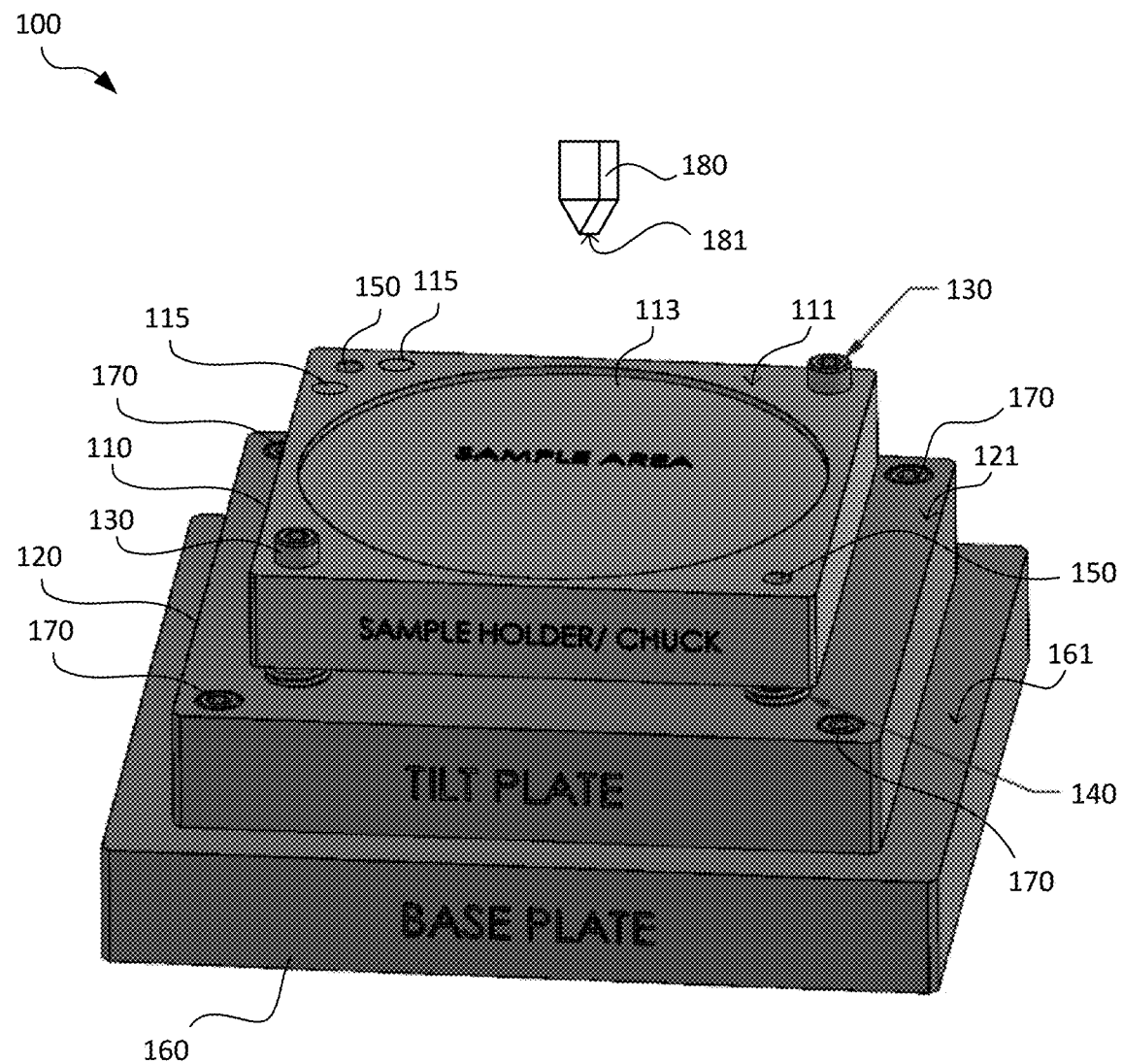
FIG. 1 is a perspective view of an apparatus according to an embodiment of the present disclosure.
Figure 2:
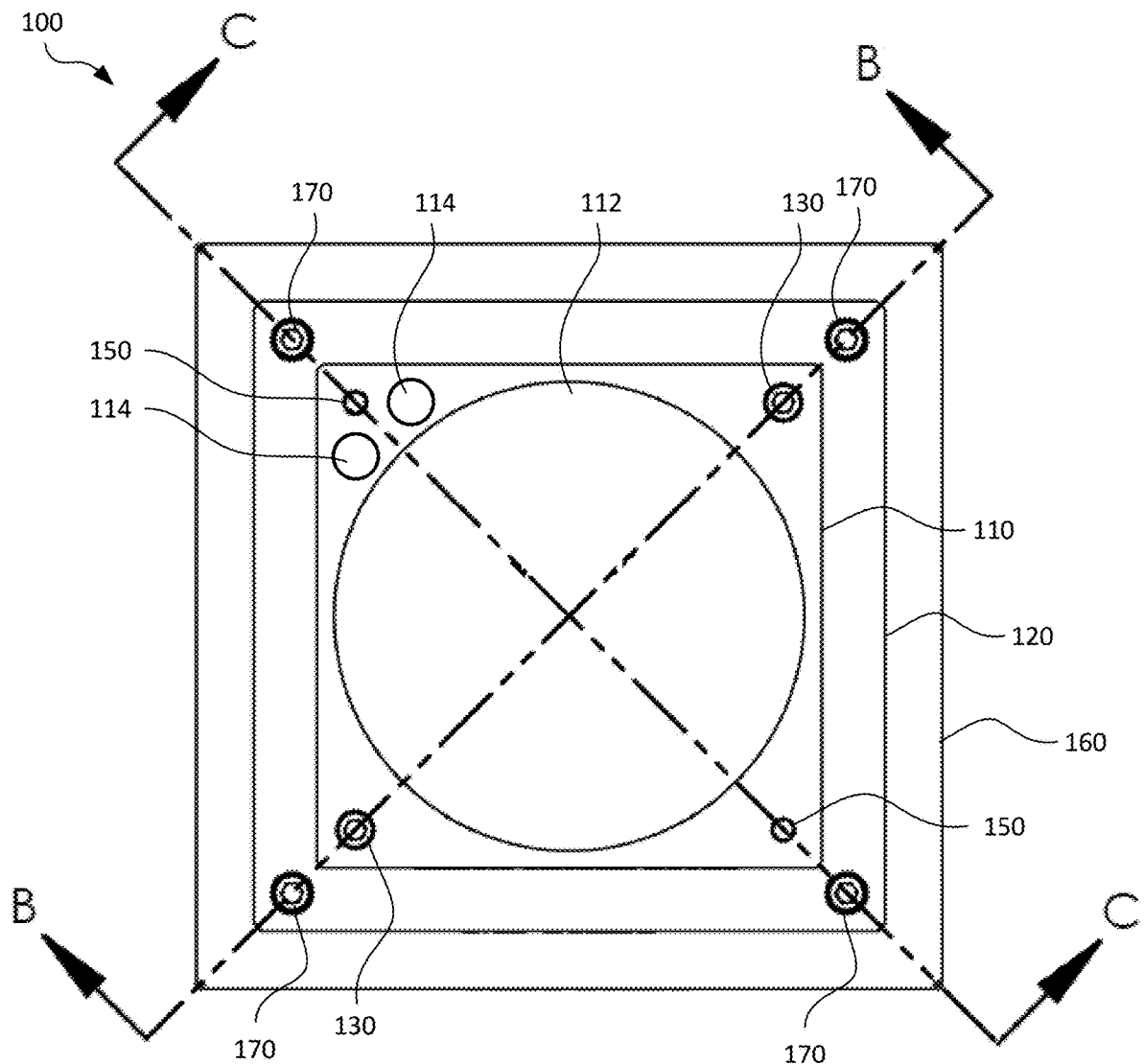
FIG. 2 is a top view of an apparatus according to an embodiment of the present disclosure.

An embodiment of the present disclosure provides an apparatus 100, as shown in FIGS. 1 and 2. The apparatus 100 may comprise a chuck 110. The chuck 110 may be configured to hold a wafer 112. The wafer 112 may be circular, having a diameter of up to 300 mm. The wafer 112 may be disposed within a sample area 113 on a top surface 111 of the chuck 110. The sample area 113 may be recessed in the top surface 111 of the chuck 110. The sample area 113 may be disposed centrally in the top surface 111 of the chuck 110. The chuck 110 may be configured to hold a reference sample 114. The reference sample 114 may be a fused silica or aluminum wafer. The reference sample 114 may be used for indirect verification of force and depth measurements or for positional calibration of an indenter tip. The reference sample 114 may be disposed within a reference area 115 on the top surface 111 of the chuck 110. The reference area 115 may be separate from the sample area 113. For example, the reference area 115 may be disposed in a corner of the top surface 111 of the chuck 110. The reference area 115 may be smaller than the sample area 113. The reference area 115 may be circular, having a diameter of about 10 mm. With the sample area 113 and the reference area 115, the chuck 110 may be able to hold a wafer 112 and a reference sample 114 simultaneously, therefore it may not be necessary to exchange the reference sample 114 with the wafer 112 after performing indenter calibrations. The chuck 110 may be configured to hold a plurality of reference samples 114 disposed in a plurality of reference areas 115 on the top surface 111 of the chuck 110. The top surface 111 of the chuck 110 may have a circular or polygonal shape. For example, the top surface 111 of the chuck 110 may be square.

The apparatus 100 may further comprise a tilt plate 120. The tilt plate 120 may be disposed beneath the chuck 110. A top surface 121 of the tilt plate 120 may have a circular or polygonal shape. For example, the top surface 121 of the tilt plate 120 may be square. The tilt plate 120 may be larger than the chuck 110. For example, an area of the top surface 121 of the tilt plate 120 may be greater than an area of the top surface 111 of the chuck 110. The tilt plate 120 may be adjustably connected to the chuck 110 by a pair of upper screws 130 and a pair of lower screws 140. The pair of upper screws 130 and the pair of lower screws 140 may be separately arranged in opposite corners of the chuck 110. In other words, one of the pair of upper screws 130 or one of the pair of lower screws 140 may be arranged in each corner of the chuck 110, and the other one of the pair of upper screws 130 or the other one of the pair of lower screws 140 may be arranged in the opposite corner of the chuck 110. For example, the pair of upper screws 130 and the pair of lower screws 140 may be arranged in a square shape. The pair of upper screws 130 may be identical to the pair of lower screws 140.

While screw is used herein, this is meant to refer to threaded rods or other threaded fasteners known in the art. Thus, a screw can include a bolt in an instance. The screws used herein may have right-hand thread, where threads run clockwise, or left-hand thread, where threads run counter-clockwise, or any combination thereof.

Figure 3:
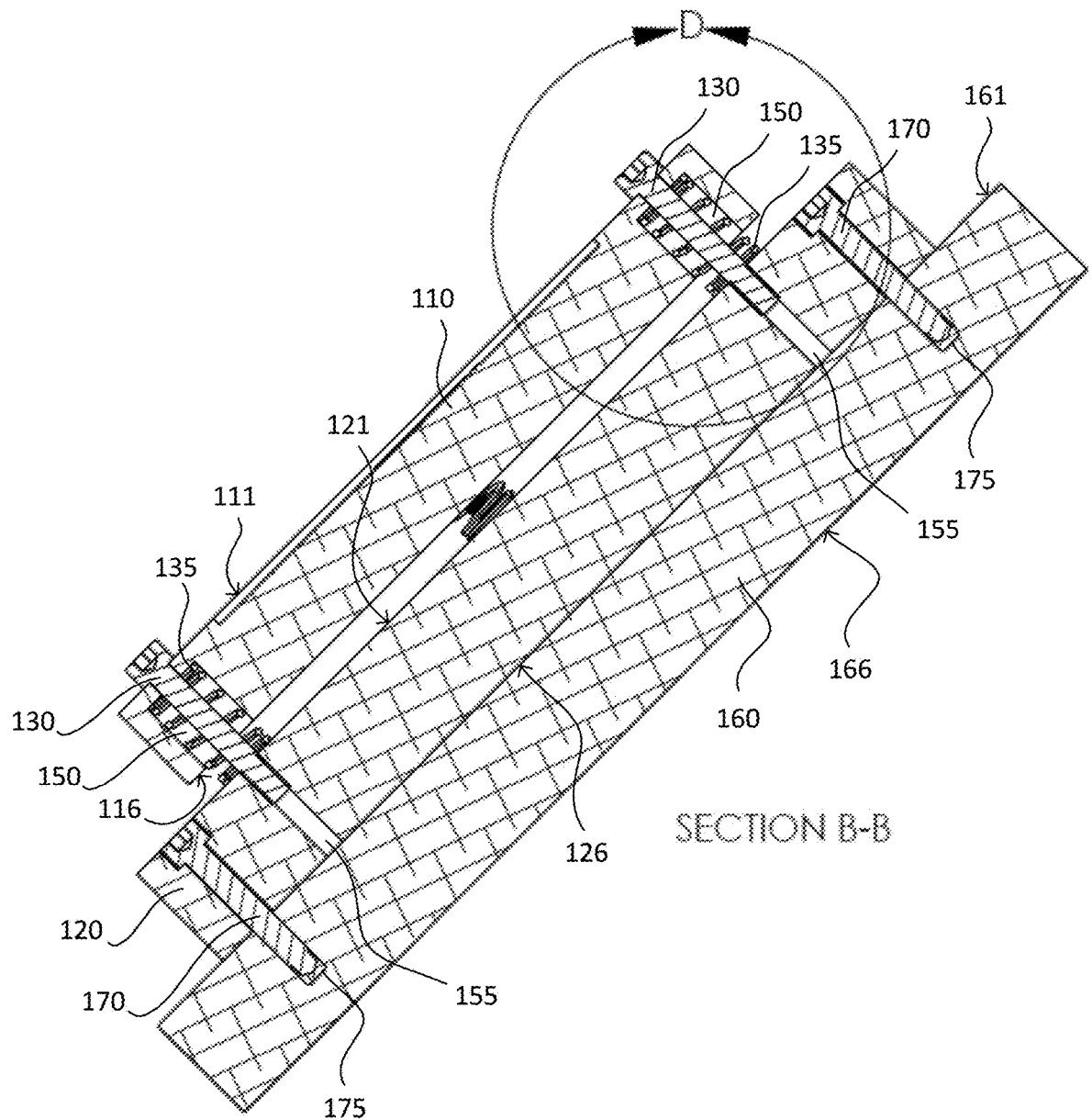
FIG. 3 is a section view along line B-B of FIG. 2.
Figure 4:
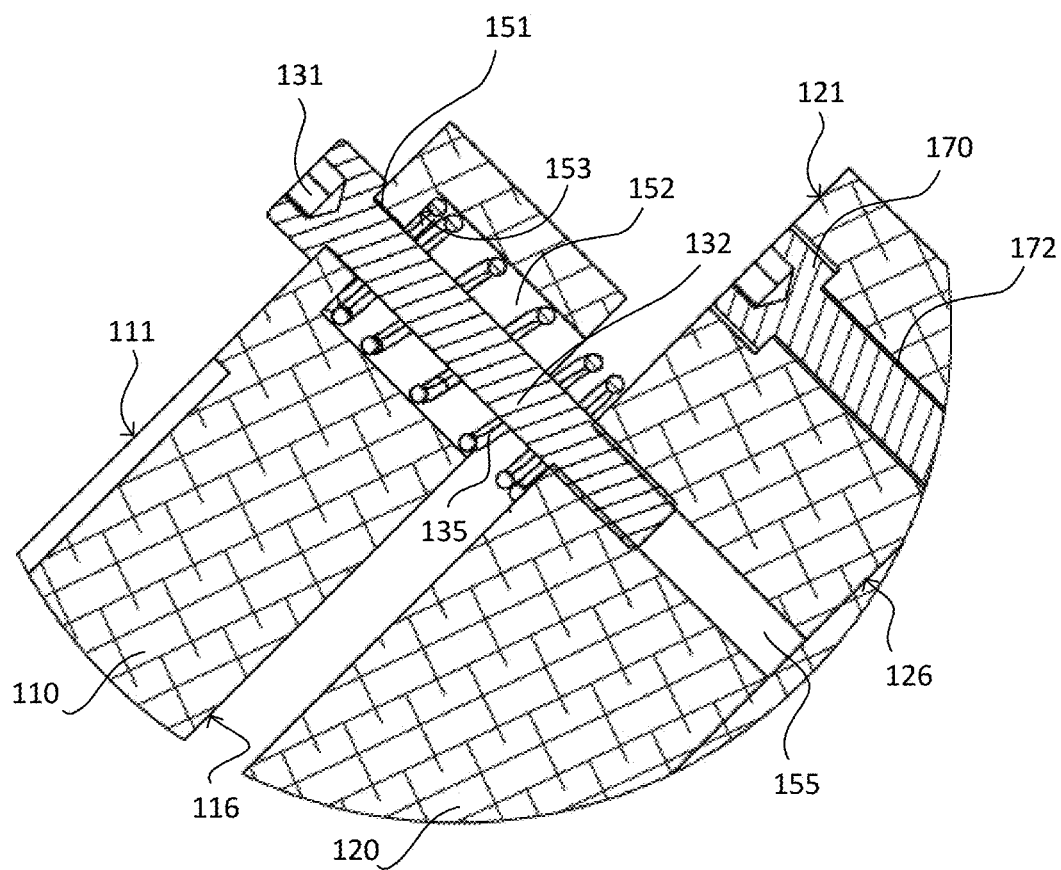
FIG. 4 is a detail view of detail D of FIG. 3.

As shown in FIGS. 3 and 4, the pair of upper screws 130 may be socket cap screws. The pair of upper screws 130 may each comprise a screw head 131 and a screw shaft 132. The screw heads 131 of the pair of upper screws 130 may rest against the top surface 111 of the chuck 110. Clockwise rotation of one of the upper screws 130 may push a corresponding corner of the chuck 110 toward the tilt plate 120.

Figure 5:
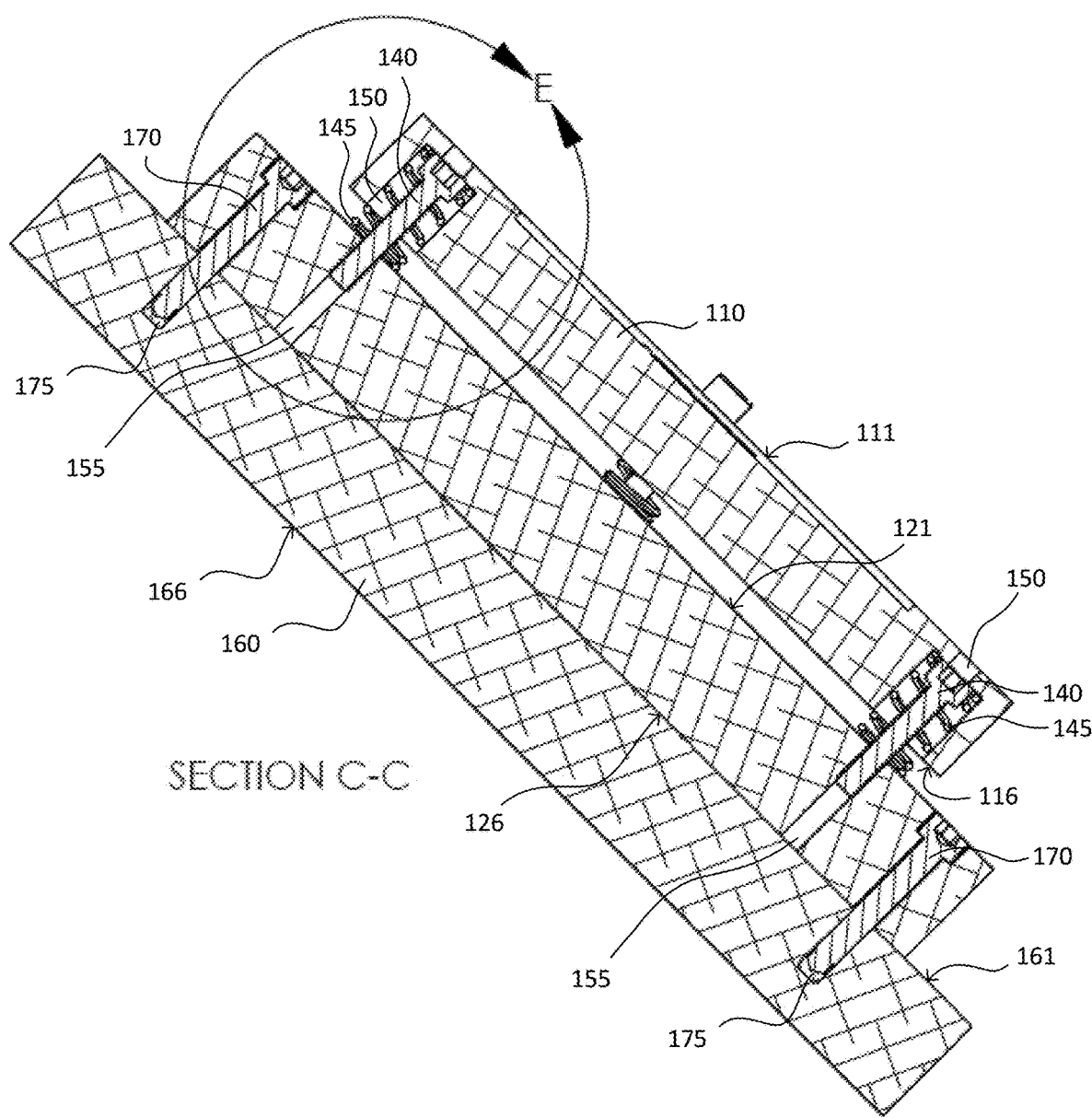
FIG. 5 is a section view along line C-C of FIG. 2.
Figure 6:
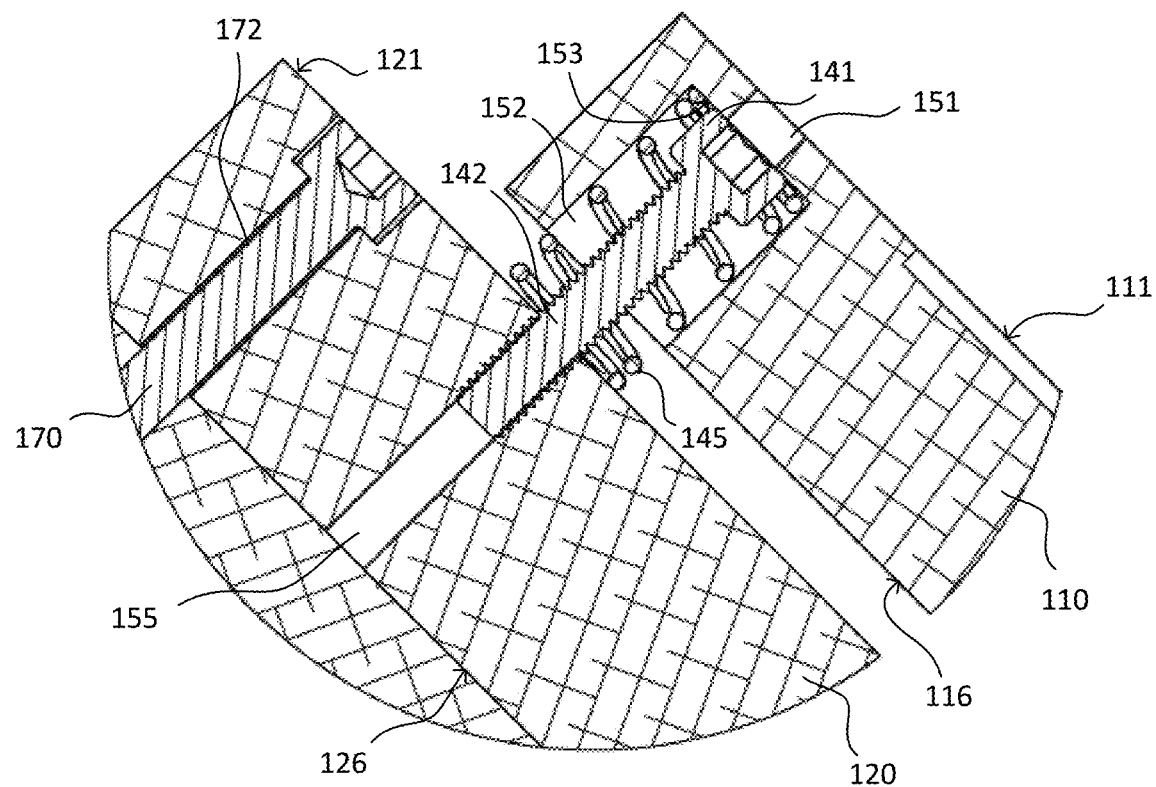
FIG. 6 is a detail view of detail E of FIG. 5.

As shown in FIGS. 5 and 6, the pair of lower screws 140 may be socket cap screws. The pair of lower screws 140 may each comprise a screw head 141 and a screw shaft 142. The screw heads 141 of the pair of lower screws 140 may rest against a bottom surface 116 of the chuck 110. Counter-clockwise rotation of one of the lower screws 140 may push a corresponding corner of the chuck 110 away from the tilt plate 120.

The pair of upper screws 130 and the pair of lower screws 140 may be standard socket cap screws having coarse pitch. Socket cap screws having fine pitch may be used, which may allow finer vertical adjustment of the chuck 110 with each rotation of the pair of upper screws 130 and the pair of lower screws 140.

As shown in FIGS. 3-6, the apparatus 100 may further comprise a pair of upper springs 135 surrounding the pair of upper of screws 130, and a pair of lower springs 145 surrounding the pair of lower screws 140. For example, an inner diameter of the pair of upper springs 135 may be greater than a diameter of the screw heads 131 of the pair of upper screws 130, and an inner diameter of the pair of lower springs 145 may be greater than a diameter of the screw heads 141 of the pair of lower screws 140. The pair of upper springs 135 and the pair of lower springs 145 may be coil springs. The pair of lower springs 145 and the pair of upper springs 135 may have a pre-load between the bottom surface 116 of the chuck 110 and the top surface 121 of the tilt plate 120. The pair of upper springs 135 and the pair of lower springs 145 may be strong enough to lift the weight of the chuck 110. In other words, the particular springs used may depend on the characteristics of the chuck 110 (e.g., the dimensions, weight, material). The pair of upper springs 135 and the pair of lower springs 145 may therefore ensure that the chuck 110 remains spaced apart from the tilt plate 120 and maintains contact with the pair of upper screws 130 and the pair of lower screws 140 during the adjustment process.

Counter-clockwise rotation of one of the upper screws 130 may cause the corresponding one of the upper springs 135 to push the corresponding corner of the chuck 110 away from the tilt plate 120. Clockwise rotation of one of the lower screws 140 may separate the screw head 141 of the lower screw 140 from the bottom surface 116 of the chuck 110, thereby causing one of the lower springs 145 to support the corresponding corner of the chuck 110.

In some embodiments, the pair of upper screws 130 and the pair of lower screws 140 may be rotated manually. For example, the pair of upper screws 130 and the pair of lower screws 140 may be rotated by a hand screw driver. In other embodiments, the pair of upper screws 130 and the pair of lower screws 140 may be rotated automatically. For example, the pair of upper screws 130 and the pair of lower screws 140 may be rotated by motorized controls.

The chuck 110 may include four throughbores 150 extending from the top surface 111 of the chuck 110 to the bottom surface 116 of the chuck 110. The throughbores 150 may be non-threaded. At least part of the pair of upper screws 130 and at least part of the pair of lower screws 140 may be disposed within the throughbores 150. Remaining parts of the pair of upper screws 130 and remaining parts of the lower screws 140 may extend out of the bottom surface 116 of the chuck 110. Each of the throughbores 150 may comprise an upper section 151 opening to the top surface 111 of the chuck 110 and a lower section 152 opening to the bottom surface 116 of the chuck 110. A diameter of the upper section 151 may be less than a diameter of the lower section 152. For example, the diameter of the upper section 151 may be less than a diameter of the screw heads 131, 141 and may be greater than a diameter of the screw shafts 132, 142. The diameter of the lower section 152 may be greater than an outer diameter of the pair of upper springs 135 and the pair of lower springs 145. The upper section 151 and the lower section 153 may define an annular surface 153 therebetween. As used herein, the annular surface 153 may be considered to be part of the bottom surface 116 of the chuck 110 that is recessed within the throughbore 150.

As shown in FIG. 4, the screw shafts 132 of the pair of upper screws 130 may extend through the upper section 151 and the lower section 152 of the corresponding throughbores 150 and out of the bottom surface 116 of the chuck 110. In this way, the screw heads 131 of the pair of upper screws 130 may rest against the top surface 111 of the chuck 110.

As shown in FIG. 6, the screw heads 141 of the pair of lower screws 140 may be disposed in the lower section 152 of the corresponding throughbores 150. The screw heads 141 may rest against the annular surface 153. In this way, the screw heads 141 may be accessible via the upper section 151 in order to turn the pair of lower screws 140. For example, a screw driver may be inserted through the upper section 151 to turn one of the lower screws 140. The screw shafts 142 of the pair of lower screws 140 may extend through the lower section 152 of the corresponding throughbores 150 and out of the bottom surface 116 of the chuck 110.

As shown in FIGS. 3-6, the pair of upper springs 135 and the pair of lower springs 145 may be disposed in the lower section 152 of each of the throughbores 150. The pair of upper springs 135 and the pair of lower springs 145 may rest against the annular surface 153. In this way, the pair of upper springs 135 and the pair of lower springs 145 may have a pre-load between the annular surface 153 of the chuck 110 and the top surface 121 of the tilt plate 120.

The tilt plate 120 may include four threaded holes 155. The threaded holes 155 may aligned with the four throughbores 150. For example, the threaded holes 155 may be arranged in a square shape. The pair of upper screws 130 and the pair of lower screws 140 may be threadably received by the threaded holes 155. The threaded holes 155 may have the same threading as the pair of upper screws 130 and the pair of lower screws 140. The threaded holes 155 may extend at least partially through the tilt plate 120. For example, the threaded holes 155 may extend from the top surface 121 of the tilt plate 120 to a bottom surface 126 of the tilt plate.

With the apparatus 100 of the present disclosure, the chuck 110 may be secured to the tilt plate 120 by the pair of upper screws 130 and the pair of lower screws 140, such that the chuck 110 is sandwiched and compressed between the screw heads 131 of the pair of upper screws 130 and the screw heads 141 of the pair of lower screws 140 when the pair of upper screws 130 are turned in a clockwise direction and the pair of lower screws 140 are turned in a counter-clockwise direction. In this way, the chuck 110 may be stable and have a high stiffness that has low positional variation. By turning one of the lower screws 140 in a clockwise direction, the chuck 110 may no longer by compressed between the screw heads 131 of the pair of upper screws 130 and the screw heads 141 of the pair of lower screws 140, such that a subsequent or simultaneous clockwise or counter-clockwise rotation of one of the upper screws 130 and/or clockwise rotation of the other one of the lower screws 140 may alter the tilt alignment of the chuck 110 relative to the tilt plate 120. In this way, adjacent upper screws 130 and lower screws 140 can be adjusted simultaneously to tilt the chuck 110 about a single axis.

It should be understood that the range of angles that the chuck 110 may be tilted relative to the tilt plate 120 may be dictated by a side length of the chuck 110 and the separation between the chuck 110 and the tilt plate 120. Greater tilt range may be achieved by increasing the separation between the bottom surface 116 of the chuck 110 and the top surface 121 of the tilt plate 120, relative to the side length of the chuck 110.

Referring back to FIGS. 1 and 2, the apparatus 100 may further comprise a base plate 160. The base plate 160 may be disposed beneath the tilt plate 120. For example, the bottom surface 126 of the tilt plate 120 may be disposed on a top surface 161 if the base plate 160. The top surface 161 of the base plate 160 may have a circular or polygonal shape. For example, the top surface 161 of the base plate 160 may be square. The base plate 160 may be larger than the tilt plate 120. For example, an area of the top surface 161 of the base plate 160 may be greater than an area of the top surface 121 of the tilt plate 120. In some embodiments, the base plate 160 may be part of a semiconductor tool.

The base plate 160 may be removably secured to the tilt plate 120 by a plurality of securing screws 170. The plurality of securing screws 170 may be socket cap screws. The plurality of securing screws 170 may be evenly spaced apart on the top surface 121 of the tilt plate 120. For example, the plurality of screws 170 may comprise four securing screws 170 arranged in a square shape. The plurality of securing screws 170 may be arranged on a portion of the top surface 121 the tilt plate 120 that is not covered by the chuck 110. In this way, the plurality of securement screws 170 may be accessible while the chuck 110 is secured to the tilt plate 120.

As shown in FIGS. 4 and 6, the tilt plate 120 may further comprise a plurality of securement holes 172 extending from the top surface 121 of the tilt plate 120 to the bottom surface 126 of the tilt plate 120. The securement holes 172 may be non-threaded. At least part of the plurality of securement screws 170 may be disposed within the plurality of securement holes 172. Remaining parts of the plurality of securement screws 170 may extend out of the bottom surface 126 of the tilt plate 120. The plurality of securement holes 172 may be countersunk or counterbored on the top surface 121 of the tilt plate 120. In this way, the plurality of securement screws 170 may be flush with the top surface 121 of the tilt plate 120 when disposed in the plurality of securement holes 172.

As shown in FIGS. 3 and 5, the base plate 160 may comprise a plurality of receiving holes 175. The plurality of receiving holes 175 may be aligned with the plurality of securement holes 172. For example, the plurality of receiving holes 175 may be arranged in a square shape. The plurality of securement screws 170 may be threadably received by the plurality of receiving holes 175. The plurality of receiving holes 175 may have the same threading as the plurality of securement screws 170. The receiving holes 175 may extend at least partially through the base plate 160. For example, the receiving holes 175 may extend from the top surface 161 of the base plate 160 to a depth that may not reach a bottom surface 166 of the base plate 160.

With the apparatus 100 having the base plate 160, the assembled chuck plate 110 and tilt plate 120 can be removed from the base plate 160, while maintaining the relative alignment between the chuck plate 110 and the tilt plate 120.

Referring back to FIG. 1, the apparatus 100 may further comprise a wedge-shaped indenter 180. The wedge-shaped indenter 180 may be attached to an arm (not shown) and movable using an actuator (not shown). The wedge-shaped indenter 180 may be removable and/or replaced from the arm. The dimensions and material of the wedge-shaped indenter 180 may depend on the specific application. For example, the wedge-shaped indenter 180 may be diamond. The wedge-shaped indenter 180 may have a linear tip 181. For example, the length of the linear tip 181 may be 50 microns. The wedge-shaped indenter 180 may be configured to probe the wafer 112 disposed in the sample area 113 and/or the reference material 114 disposed in the reference area 115 of the chuck 110. The chuck 110 may lie in a plane orthogonal to the wedge-shaped indenter 180. When the chuck 110 is not in a plane orthogonal to the wedge-shaped indenter 180, the plane of the chuck 110 may be adjusted by rotation of one or more of the pair of upper screws 130 and/or one or more of the pair of lower screws 140. In this way, the chuck 110 may be secured in a plane orthogonal to the wedge-shaped indenter 180 to improve accuracy of probing measurements.

Figure 7:
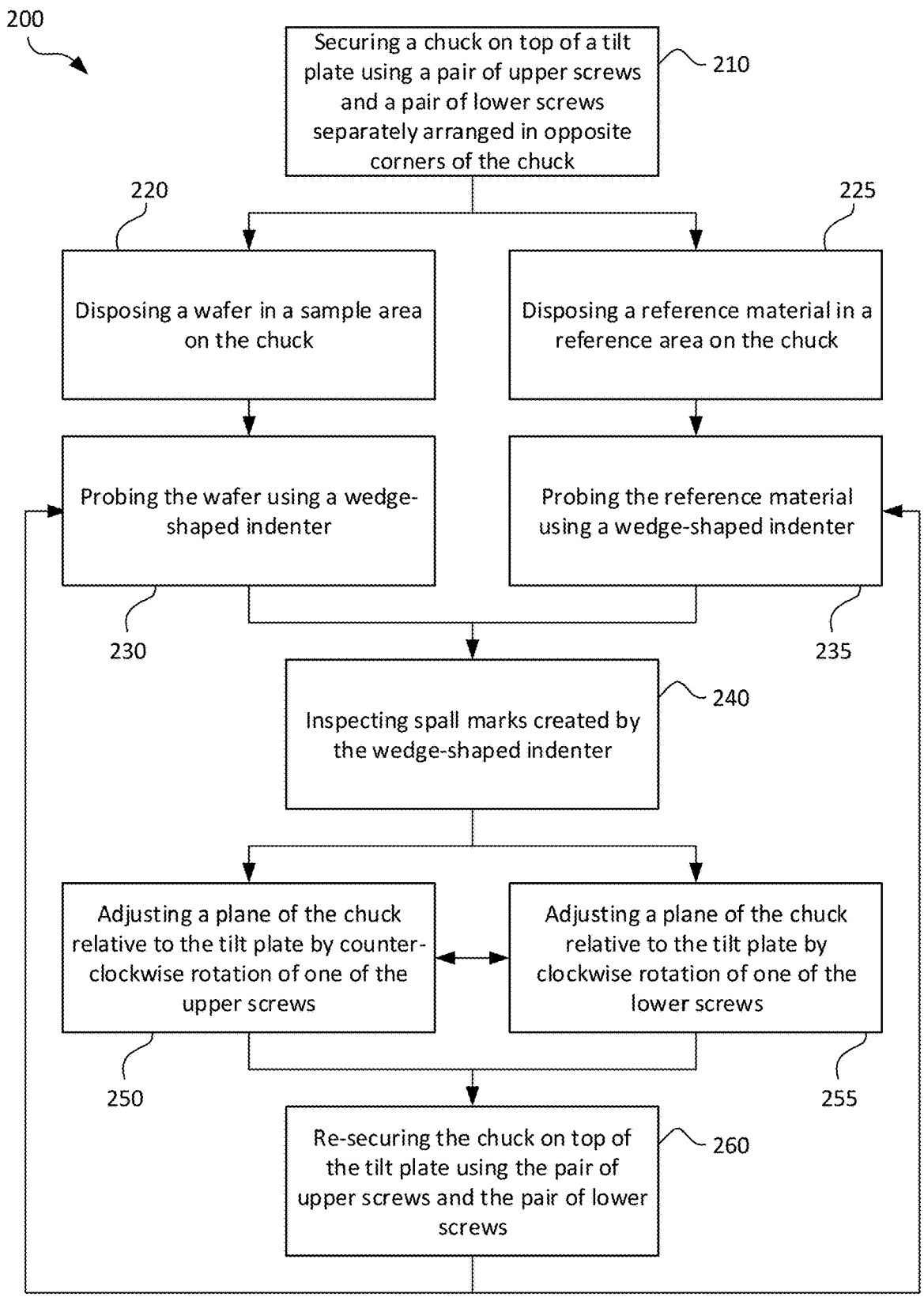
FIG. 7 is a flow chart of a method according to an embodiment of the present disclosure.

An embodiment of the present disclosure provides a method 200 shown in FIG. 7. The method 200 may comprise the following steps.

At step 210, a chuck is secured chuck on top of a tilt plate using a pair of upper screws and a pair of lower screws separately arranged in opposite corners of the chuck. A top surface of the chuck may have a circular or polygonal shape. For example, the top surface of the chuck may be square. A top surface of the tilt plate may have a circular or polygonal shape. For example, the top surface of the tilt plate may be square. The tilt plate may be larger than the chuck. For example, an area of the top surface of the tilt plate may be greater than an area of the top surface of the chuck. The pair of upper screws and the pair of lower screws may be separately arranged in opposite corners of the chuck. In other words, one of the pair of upper screws or one of the pair of lower screws may be arranged in each corner of the chuck, and the other one of the pair of upper screws or the other one of the pair of lower screws may be arranged in the opposite corner of the chuck. For example, the pair of upper screws and the pair of lower screws may be arranged in a square shape. The pair of upper screws may be identical to the pair of lower screws. The pair of upper screws and the pair of lower screws may be socket cap screws, each comprising a screw head and a screw cap.

Screw heads of the pair of upper screws rest against a top surface of the chuck, such that clockwise rotation of one of the upper screws pushes a corresponding corner of the chuck toward the tilt plate. Screw heads of the pair of lower screws rest against a bottom surface of the chuck, such that counter-clockwise rotation of one of the lower screws pushes a corresponding corner of the chuck away from the tilt plate. In this way, the chuck is compressed between the screw heads of the pair of upper screws and the screw heads of the pair of lower screws.

At step 220, a wafer is disposed on the chuck. The wafer may be circular, having a diameter of up to 300 mm. The wafer may be disposed within a sample area on the top surface of the chuck. The sample area may be recessed in a top surface of the chuck. The sample area may be disposed centrally in the top surface of the chuck.

According to an embodiment of the present disclosure, the method 200 may further comprise the following step.

At step 230, the wafer disposed in a sample area on the top surface of the chuck is probed using a wedge-shaped indenter. The sample area may be recessed in the top surface of the chuck. The sample area may be disposed centrally in the top surface of the chuck. The wedge-shaped indenter may have a linear tip. The chuck may lie in a plane orthogonal to the wedge-shaped indenter. When the chuck is not in a plane orthogonal to the wedge-shaped indenter, the plane of the chuck may be adjusted by rotation of one or more of the pair of upper screws and/or one or more of the pair of lower screws. In this way, the chuck may be secured in a plane orthogonal to the wedge-shaped indenter to improve accuracy of probing measurements.

According to an embodiment of the present disclosure, the method 200 may further comprise the following steps.

At step 225, a reference material is disposed in a reference area on the top surface of the chuck. The reference area may be separate from the sample area. For example, the reference area may be disposed in a corner of the top surface of the chuck. The reference area may be smaller than the sample area. With the sample area and the reference area, the chuck may be able to hold a wafer and a reference sample simultaneously, therefore it may not be necessary to exchange the reference sample with the wafer after performing angle calibration. The chuck may be configured to hold a plurality of reference samples disposed in a plurality of reference areas on the top surface of the chuck.

At step 235, the reference material is probed using the wedge-shaped indenter. By probing the reference material, the angle calibration of the chuck and/or calibration of the wedge-shaped indenter can be performed prior to probing the wafer. The wedge-shaped indenter can be lowered to probe reference material or the wedge-shaped indenter can otherwise be translated relative to the reference material to enable probing.

It should be understood that steps 225, 235 may be performed before step 220, between step 220 and step 230, or after step 230 and is not limited herein. For example, the wafer and the reference material may be disposed on the chuck at the same time. By probing the reference material, calibration of the chuck and the indenter may be performed before performing adhesion testing on the wafer.

According to an embodiment of the present disclosure, a pair of upper springs may surround the pair of upper of screws, a pair of lower springs may surround the pair of lower screws, and the pair of lower springs and the pair of upper springs may have a pre-load between the bottom surface of the chuck and a top surface of the tilt plate. An inner diameter of the pair of upper springs may be greater than a diameter of the screw heads of the pair of upper screws, and an inner diameter of the pair of lower springs may be greater than a diameter of the screw heads of the pair of lower screws. The pair of upper springs and the pair of lower springs may be coil springs.

The method 200 may further comprise at least one of the following steps performed after step 230 or step 235.

At step 240, spall marks created by the wedge-shaped indenter are inspected. When the wafer or reference material are probed using the wedge-shaped indenter, spall marks are created. The spall marks may be inspected to determine the relative alignment of the chuck to the wedge-shaped indenter. Inspection may be performed using an optical microscope, which may be integrated in the probing system. When the spall marks appear symmetrical, the chuck may be orthogonal to the wedge-shaped indenter. When the spall marks appear asymmetrical, the chuck may be misaligned from the wedge-shaped indenter, such that a plane of the chuck may require adjustment to reach an orthogonal alignment. For example, at least one of the following steps may be performed after step 240.

At step 250, a plane of the chuck is adjusted relative to the tilt plate by counter-clockwise rotation of one of the upper screws, which causes the corresponding one of the upper springs to push the corresponding corner of the chuck away from the tilt plate.

At step 255, a plane of the chuck is adjusted relative to the tilt plate by clockwise rotation of one of the lower screws, which separates the screw head of the lower screw from the bottom surface of the chuck.

After step 250 and/or step 255, step 250 and/or step 255 may be repeated with a different one of upper screws and/or lower screws to further adjust the plane of the chuck relative to the tilt plate. When the plane is set at a desired angle (e.g., such that the plane of the chuck is orthogonal to the wedge-shaped indenter), the chuck may be re-secured on top of the tilt plate using the pair of upper screws and the pair of lower screws at step 260. In particular, any one of the upper screws not rotated in step 250 may be rotated clockwise to push a corresponding corner of the chuck toward the tilt plate, and/or any one of the lower screws not rotated in step 255 may be rotated counter-clockwise to push a corresponding corner of the chuck away from the tilt plate, thereby sandwiching and compressing the chuck between the screw heads of the pair of upper screws and the screw heads of the pair of lower screws in a new tilt-adjusted position that is stable and stiff with low positional variation.

In some embodiments, the pair of upper screws and the pair of lower screws may be rotated manually. For example, the pair of upper screws and the pair of lower screws may be rotated by a hand screw driver. In other embodiments, the pair of upper screws and the pair of lower screws may be rotated automatically. For example, the pair of upper screws and the pair of lower screws may be rotated by motorized controls.

It should be understood that after performing step 260, step 230 and/or step 235 may be repeated. For example, after adjusting the plane of the chuck to a new tilted position, the wafer or the reference material may be probed again with the wedge-shaped indenter. Then step 240 may be repeated to inspect the new spall marks. If the new spall marks appear symmetrical, the chuck may be orthogonal to the wedge-shaped indenter. If the new spall marks appear asymmetrical, the plane of the chuck may require further adjusting, and step 250 and/or step 255, and step 260 may be repeated until an orthogonal alignment is reached, which may be confirmed by repeating the probing in step 230 and/or step 235, and the inspection in step 240.

With the method 200 of the present disclosure, the chuck may be secured to the tilt plate by the pair of upper screws and the pair of lower screws, such that the chuck is sandwiched and compressed between the screw heads of the pair of upper screws and the screw heads of the pair of lower screws when the pair of upper screws are turned in a clockwise direction and the pair of lower screws are turned in a counter-clockwise direction. In this way, the chuck may be stable and have a high stiffness that has low positional variation. By turning one of the lower screws in a clockwise direction, the chuck may no longer by compressed between the screw heads of the pair of upper screws and the screw heads of the pair of lower screws, such that a subsequent or simultaneous clockwise or counter-clockwise rotation of one of the upper screws and/or clockwise rotation of the other one of the lower screws may alter the tilt alignment of the chuck plate relative to the tilt plate. In this way, adjacent upper screws and lower screws can be adjusted simultaneously to tilt the chuck about a single axis such that the plane of the chuck is orthogonal to the wedge-shaped indenter for improved accuracy of adhesion testing.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
a chuck configured to hold a wafer; and
a tilt plate disposed beneath the chuck and adjustably connected to the chuck by a pair of upper screws and a pair of lower screws separately arranged in opposite corners of the chuck;
wherein screw heads of the pair of upper screws rest against a top surface of the chuck, such that clockwise rotation of one of the upper screws pushes a corresponding corner of the chuck toward the tilt plate; and
wherein screw heads of the pair of lower screws rest against a bottom surface of the chuck, such that counter-clockwise rotation of one of the lower screws pushes a corresponding corner of the chuck away from the tilt plate.

2. The apparatus of claim 1, further comprising:
a pair of upper springs surrounding the pair of upper of screws; and
a pair of lower springs surrounding the pair of lower screws;
wherein the pair of lower springs and the pair of upper springs have a pre-load between the bottom surface of the chuck and a top surface of the tilt plate.

3. The apparatus of claim 2, wherein counter-clockwise rotation of one of the upper screws causes the corresponding one of the upper springs to push the corresponding corner of the chuck away from the tilt plate.

4. The apparatus of claim 2, wherein clockwise rotation of one of the lower screws separates the screw head of the lower screw from the bottom surface of the chuck.

5. The apparatus of claim 2, wherein the chuck includes four throughbores extending from the top surface of the chuck to the bottom surface of the chuck, and at least part of the pair of upper screws and at least part of the pair of lower screws are disposed within the throughbores.

6. The apparatus of claim 5, wherein each of the throughbores comprises:
an upper section opening to the top surface of the chuck; and
a lower section opening to the bottom surface of the chuck;
wherein a diameter of the upper section is less than a diameter of the lower section, which defines an annular surface therebetween.

7. The apparatus of claim 6, wherein screw shafts of the pair of upper screws extend through the upper section and the lower section.

8. The apparatus of claim 6, wherein the screw heads of the pair of lower screws are disposed in the lower section, rest against the annular surface, and are accessible via the upper section.

9. The apparatus of claim 6, wherein the pair of upper springs and the pair of lower springs are disposed in the lower section of each of the throughbores and rest against the annular surface.

10. The apparatus of claim 5, wherein the tilt plate includes four threaded holes aligned with the four throughbores, and the pair of upper screws and the pair of lower screws are threadably received by the threaded holes.

11. The apparatus of claim 1, wherein the top surface of the chuck plate comprises a recessed sample area configured to receive the wafer.

12. The apparatus of claim 11, wherein the top surface of the chuck plate further comprises a reference area configured to receive a reference material, the reference area being separate from the sample area.

13. The apparatus of claim 12, further comprising:
a wedge-shaped indenter configured to probe the wafer disposed in the sample area and/or the reference material disposed in the reference area;
wherein the chuck lies in a plane orthogonal to the wedge-shaped indenter.

14. The apparatus of claim 1, further comprising:
a base plate disposed beneath the tilt plate and removably secured to the tilt plate.

15. A method comprising:
securing a chuck on top of a tilt plate using a pair of upper screws and a pair of lower screws separately arranged in opposite corners of the chuck;
disposing a wafer on the chuck;
wherein screw heads of the pair of upper screws rest against a top surface of the chuck, such that clockwise rotation of one of the upper screws pushes a corresponding corner of the chuck toward the tilt plate; and
wherein screw heads of the pair of lower screws rest against a bottom surface of the chuck, such that counter-clockwise rotation of one of the lower screws pushes a corresponding corner of the chuck away from the tilt plate.

16. The method of claim 15, wherein a pair of upper springs surround the pair of upper of screws, a pair of lower springs surround the pair of lower screws, and the pair of lower springs and the pair of upper springs have a pre-load between the bottom surface of the chuck and a top surface of the tilt plate.

17. The method of claim 16, further comprising:
adjusting a plane of the chuck relative to the tilt plate by counter-clockwise rotation of one of the upper screws, which causes the corresponding one of the upper springs to push the corresponding corner of the chuck away from the tilt plate.

18. The method of claim 16, further comprising:
adjusting a plane of the chuck relative to the tilt plate by clockwise rotation of one of the lower screws, which separates the screw head of the lower screw from the bottom surface of the chuck.

19. The method of claim 15, further comprising:
probing the wafer disposed in a sample area on the top surface of the chuck using a wedge-shaped indenter;
wherein the chuck lies in a plane orthogonal to the wedge-shaped indenter.

20. The method of claim 19, further comprising:
disposing a reference material in a reference area on the top surface of the chuck; and
probing the reference material using the wedge-shaped indenter;
wherein the reference area is separate from the sample area.

\* \* \* \* \*